(12) United States Patent
Jung et al.

(10) Patent No.: US 7,157,204 B2
(45) Date of Patent: Jan. 2, 2007

(54) SOLUBLE POLYIMIDE FOR PHOTOSENSITIVE POLYIMIDE PRECURSOR AND PHOTOSENSITIVE POLYIMIDE PRECURSOR COMPOSITION COMPRISING THE SOLUBLE POLYIMIDE

(75) Inventors: Myung Sup Jung, Daejun-Shi (KR); Yong Young Park, Daejun-Shi (KR); Sung Kyung Jung, Suwon-Shi (KR); Sang Yoon Yang, Suwon-Shi (KR)

(73) Assignee: Samsung Electronics Co., Ltd., Suwon (KR)

( * ) Notice: Subject to any disclaimer, the term of this patent is extended or adjusted under 35 U.S.C. 154(b) by 59 days.

(21) Appl. No.: 10/702,741

(22) Filed: Nov. 7, 2003

(65) Prior Publication Data

US 2004/0096773 A1    May 20, 2004

(30) Foreign Application Priority Data

Nov. 7, 2002    (KR)    ...................... 10-2002-0068850

(51) Int. Cl.
G03C 1/73       (2006.01)
G03F 7/039      (2006.01)
C08G 73/10      (2006.01)

(52) U.S. Cl. ................... 430/270.1; 430/914; 430/905; 430/326; 430/311; 430/921; 430/919; 430/925; 528/351; 528/353; 528/319; 525/928

(58) Field of Classification Search ............. 430/270.1, 430/914, 905, 326, 311, 921, 919, 925; 528/351, 528/353; 525/928
See application file for complete search history.

(56) References Cited

U.S. PATENT DOCUMENTS

| | | | |
|---|---|---|---|
| 3,957,512 A | 5/1976 | Kleeberg et al. | |
| 4,093,461 A | 6/1978 | Loprest et al. | |
| 4,243,743 A | 1/1981 | Hiramoto et al. | |
| 4,880,722 A | 11/1989 | Moreau et al. | |
| 4,927,736 A | 5/1990 | Mueller et al. | |
| 4,942,108 A | 7/1990 | Moreau et al. | |
| 6,541,178 B1 | 4/2003 | Jung et al. | |
| 2002/0093077 A1* | 7/2002 | Jung et al. | ................... 257/642 |
| 2004/0029045 A1* | 2/2004 | Nunomura et al. | ...... 430/283.1 |

FOREIGN PATENT DOCUMENTS

| | | |
|---|---|---|
| JP | 60-37550 | 2/1985 |
| JP | 62-135824 | 6/1987 |
| JP | 64-60630 | 3/1989 |
| JP | 7-33874 | 2/1995 |
| JP | 7-134414 | 5/1995 |
| JP | 52-13315 | 2/1997 |

* cited by examiner

*Primary Examiner*—Sin Lee
(74) *Attorney, Agent, or Firm*—Lee & Morse, P.C.

(57) ABSTRACT

A soluble polyimide for a photosensitive polyimide precursor and a photosensitive polyimide precursor composition including the soluble polyimide, wherein the soluble polyimide contains hydroxyl and acetyl moieties and at least one reactive end-cap group at one or both ends of the polymer chain. The photosensitive polyimide precursor composition comprises the soluble polyimide, a polyamic acid containing at least one reactive end-cap group at one or both ends of the polymer chain, a photo acid generator (PAG) and optionally a dissolution inhibitor. Since the polyimide film of the present invention exhibits excellent thermal, electric and mechanical properties, it can be used as insulating films or protective films for various electronic devices. A pattern with a high resolution may be formed even on the polyamide film having a thickness of above 10 μm.

15 Claims, 2 Drawing Sheets

SOLUBLE POLYIMIDE FOR PHOTOSENSITIVE POLYIMIDE PRECURSOR AND PHOTOSENSITIVE POLYIMIDE PRECURSOR COMPOSITION COMPRISING THE SOLUBLE POLYIMIDE

BACKGROUND OF THE INVENTION

1. Field of the Invention

The present invention relates to a soluble polyimide for a photosensitive polyimide precursor and a photosensitive polyimide precursor composition comprising the soluble polyimide. More particularly, the present invention relates to a soluble polyimide for a photosensitive polyimide precursor that contains hydroxyl groups and acetal groups in its side chains and at least one reactive end-cap group at one or both ends of the polymer chain. The invention also relates to a photosensitive polyimide precursor composition that comprises the soluble polyimide, a polyamic acid containing at least one reactive end-cap group at one or both ends of the polymer chain, a photo acid generator (PAG) and, optionally, a dissolution inhibitor.

2. Description of the Related Art

Recently, high purity organic materials with high processing ability have been studied as materials useful for electronic devices since electronic devices, such as semiconductors and liquid crystal display (LCD) devices, have been required to have higher integrity or density, and to be more reliable and more speedy. Suitable materials for electronic devices must exhibit thermal stability even under manufacturing conditions above 200° C., excellent mechanical strength, low dielectric constant, high insulation characteristic, good planarizing properties, and also have a low content of impurities that can cause damage to the reliability of the devices. If necessary, the materials should be capable of being easily processed into a fine shape. Since polyimides meet the above criteria, special attention has been paid to the polyimides.

Generally, a polyimide is synthesized through a two-step polycondensation: (i) a first polymerization is carried out by polymerizing diamine and dianhydride in a polar organic solvent such as NMP, DMAc and DMF to obtain a polyimide precursor solution; and (ii) a second imidization is carried out by heating the polyimide precursor solution or film to obtain a polyimide in its cured form. The polyimide thus prepared is a type of engineering plastic, and has many advantages such as good mechanical properties, high heat resistance, high insulation and good planarization properties.

FIG. 1 illustrates an example of the use of a polyimide resin for an electronic device. As shown in FIG. 1, a resin molded LSI includes a polyimide buffer coating layer of 10 μm or more (in thickness), which is inserted between a chip and a packaging material in order to prevent a passivation layer of the chip from being cracked, or to prevent a metal wiring from being damaged by volume shrinkage of the resin, and by a possible difference between heat expansion coefficients of the chip and the resin after molding. The polyimide buffer coating layer should have fine patterns for an inter-electrode connector and a wire bonding on its surface. For forming the fine patterns on the surface, in the conventional method, a photoresist is coated onto a polyimide film and is removed after the etching process. However, since the etching process incurs considerable cost and is liable to cause many defects, earnest studies have been made on imparting photosensitivity to a polyimide itself.

For example, U.S. Pat. No. 3,957,512 issued to Rubner, et al. from Siemens AG discloses polyamic acids to which a photosensitive functional group is bound through ester bonding; and U.S. Pat. No. 4,243,743 to Toray industries, Japan, discloses a polyamic acid as a precursor for a photosensitive polyimide, which has a photosensitive functional group and an ionically-bound amino group. These two patents disclose a negative-type photoresist composition, and so the composition containing the polyimide or its precursor is coated on a substrate and partially exposed to light under a photo-mask in order to obtain a desired pattern. By irradiation, the exposed parts become insoluble owing to photopolymerization and photo-cross-linking between the precursors and, through a developing process with organic solvent, a desired pattern is made and then goes through further imidization reaction to obtain a polyimide layer having a prescribed pattern.

However, when compared with a positive-type photoresist, not only does the above negative-type photoresist have lower resolution and greater risk of defects, but because it requires the use of an organic solvent (i.e. NMP or DMAc) as a developer, it is not preferred from an economical or environmental point of view. Therefore, there has been extensive research regarding polyimides to be used as a positive-type photoresist composition.

For example, Japanese Patent Laid-Open Nos. 52-13315 and 62-135824 disclose a method of forming a pattern from a mixture of a polyamic acid (as a polyimide precursor) and naphthoquinonediazide (as a dissolution inhibitor) by using the difference between dissolution rates of an exposed portion and a non-exposed portion. Japanese Patent Laid-Open No. 64-60630 discloses a method of using a mixture of an organic solvent-soluble polyimide resin having hydroxyl groups and a naphthoquinonediazide compound. Japanese Patent Laid-Open No. 60-37550 discloses a photosensitive polyimide, which has a photosensitive group of o-nitrobenzyl group onto a polyimide precursor through an ester bonding. Japanese Patent Laid-Open Nos. 7-33874 and 7-134414 disclose a chemically-amplified composition comprising a resin and a Photo-Acid Generator, the resin being obtained by converting carboxylic groups of a polyamic acid into functional groups capable of being dissociated by an acid.

The photoresist compositions described in the above documents have many drawbacks. First, these conventional photoresist compositions require a large amount of photosensitizer since the difference in dissolution rates between an exposed portion and a non-exposed portion is not large enough to form a pattern with high resolution. In addition, when coated on a substrate, the planarization characteristics of these conventional photoresist compositions are not satisfactory. Moreover, despite adding the large amount of the photosensitizer, the sensitivity is still inadequate in many cases, and thus a thick polyimide layer cannot be easily attained. Further, even in case where the thickness of resulting film is acceptable, severe film shrinkage occurs during curing and many of the physical properties of the obtained polyimide film are not good, so the material is not thought to be suitable as a buffer layer. For those reasons, conventional photosensitive polyimides have still been limited in their practical applications until now.

The description herein of disadvantages associated with known materials, methods, and apparatus is in no way intended to limit the present invention. Indeed, various features of embodiments of the invention may employ one or more known materials, methods, and apparatus without suffering from the above described disadvantages.

SUMMARY OF THE INVENTION

The present inventors devoted much effort to solving the problems of the conventional methods and compositions and found that, when using a photoresist composition comprising a specific soluble polyimide that contains hydroxyl and acetal moieties and at least one reactive end-cap group at one or both ends of the polymer chain and a polyamic acid that contains at least one reactive end-cap group at one or both ends of the polymer chain, not only is the required amount of PAG reduced owing to a bigger difference in solubility between the exposed and the unexposed parts, but also patterns with a very high resolution can be obtained. Also, films prepared from the compositions exhibit only slight shrinkage in the curing process and, in addition, the general properties of the resulting films are excellent.

Therefore, a first feature of an embodiment of the present invention is to provide a soluble polyimide that can be used in a photosensitive polyimide precursor composition, which can produce a film having a pattern of high resolution, low shrinkage rate and other excellent properties. Another preferred feature of the present invention is to provide a photosensitive polyimide precursor composition comprising the soluble polyimide and a polyamic acid with a specific structure. It is yet another preferred feature of the present invention to provide a photosensitive polyimide precursor composition further comprising a dissolution inhibitor with a specific structure.

To achieve these and other features of various embodiments of the present invention, there is provided a soluble polyimide comprising at least one reactive end-cap group at one or both ends of the polymer chain, represented by the following Formula 1:

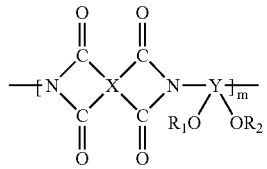

Formula 1 wherein

X is a tetravalent aromatic or aliphatic organic group;

Y is a tetravalent aromatic or aliphatic organic group;

each of $R_1$ and $R_2$ is independently H or $CH_2OR_3$ (in which $R_3$ is an alkyl group having not more than 6 carbon atoms, and with the proviso that both $R_1$ and $R_2$ are not H); and m is an integer of from about 10–1000.

In accordance with an additional feature of the invention, there is provided a positive-type photosensitive polyimide precursor composition comprising the soluble polyimide having Formula 1 described above, a polyamic acid containing at least one reactive end-cap group at one or both ends of the polymer chain, a Photo Acid Generator (hereinafter, PAG), a polar solvent, and optionally a dissolution inhibitor.

BRIEF DESCRIPTION OF THE DRAWINGS

The above features and advantages of the present invention will become more apparent from the following detailed description of the preferred embodiments, taken in conjunction with the accompanying drawings, in which.

DESCRIPTION OF THE PREFERRED EMBODIMENTS

Figure 1:
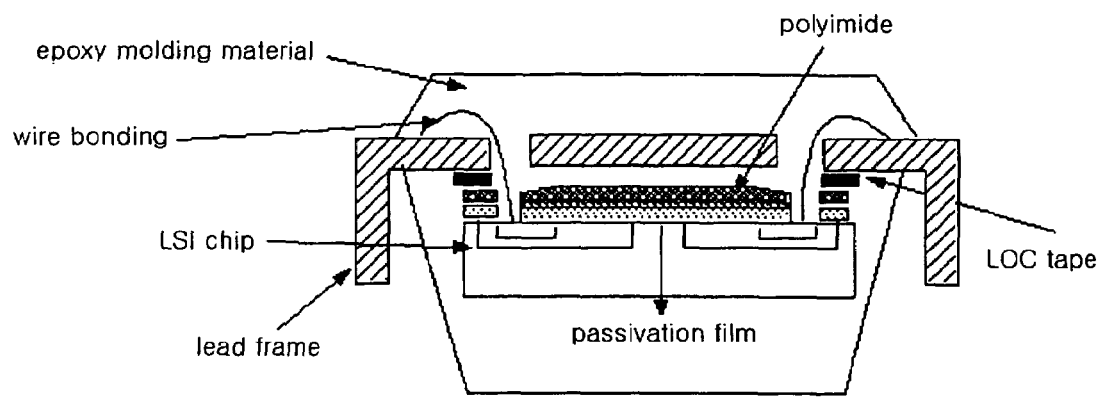
FIG. 1 is a side, cross-sectional view illustrating a structure of a semiconductor device in which a polyimide resin is used as a buffer coating layer film.
Figure 2:
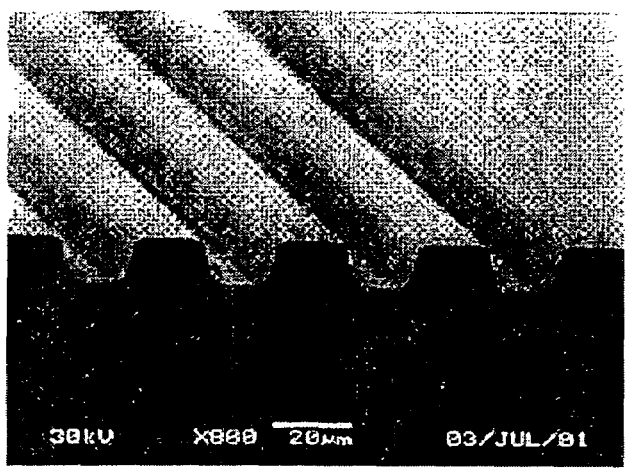
FIG. 2 is a photograph showing a sectional view of a pattern having a line width of 5 μm formed on a film having a thickness of 10 μm, produced from a polyimide precursor composition according to the present invention.

Korean patent application No. 2002-68850, filed on Nov. 7, 2002, and entitled "Soluble Polyimide for Photosensitive Polyimide Precursor and Photosensitive Polyimide Precursor Composition Comprising the Soluble Polyimide," is incorporated by reference herein in its entirety.

A soluble polyimide for a photosensitive polyimide precursor according to the present invention contains at least one reactive end-cap group at one or both ends of the polymer chain, represented by the following Formula 1:

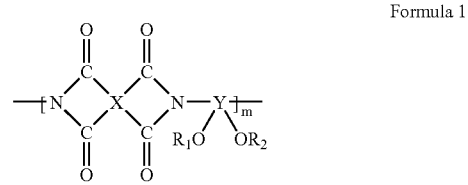

Formula 1 wherein

X is a tetravalent aromatic or aliphatic organic group;

Y is a tetravalent aromatic or aliphatic organic group;

each of $R_1$ and $R_2$ is independently H or $CH_2OR_3$ (in which $R_3$ is an alkyl group having not more than 6 carbon atoms, and with the proviso that both $R_1$ and $R_2$ are not H); and m is an integer of from about 10–1000.

X in the above Formula 1 is preferably an aromatic organic group, and more preferably is selected from the group consisting of:

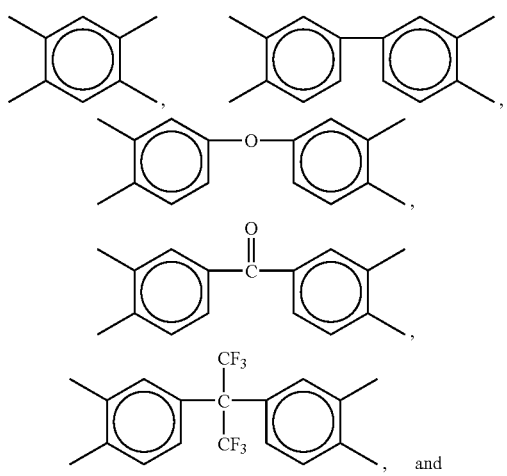

, and

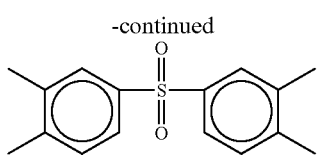

Y in the above Formula 1 is preferably an aromatic organic group, and more preferably is selected from the group consisting of:

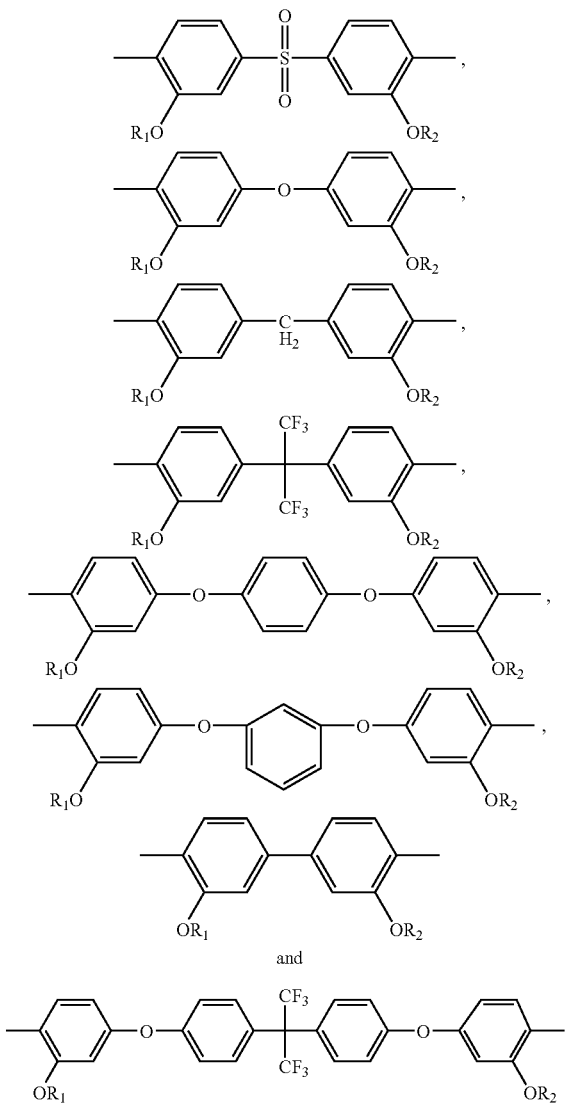

The acetal groups (that is, when either $R_1$ or $R_2$ is $CH_2OR_3$) substituted on Y in the Formula 1 play a role to change the solubility of the polymer in an aqueous alkaline solution in the presence of an acid.

Each of $R_1$ and $R_2$ in the soluble polyimide is independently H or $CH_2OR_3$, and 5% to 95%, preferably 20% to 50% of the total of the $R_1$ and $R_2$ groups are $CH_2OR_3$ groups.

The soluble polyimide exhibits good solubility in various organic solvents used in photolithography industry and good planarization characteristic upon coating. In addition, since the soluble polyimide has hydroxyl and acetal groups as its side chains, the solubility of the polymer in an aqueous alkaline solution in the presence of an acid is considerably high. Accordingly, when the soluble polyimide is used in photosensitive polyimide precursor compositions, patterns with high resolution can be advantageously attained even in the presence of a small amount of PAG. Also, when the soluble polyimide of the present invention is used in photosensitive polyimide precursor compositions, the problem of severe film shrinkage which has been one of the problems in conventional positive-type photosensitive polyimides, can be solved successfully.

The soluble polyimide contains, at one or both ends of the polymer chain, one or more reactive end-cap group(s), that is(are) to be cross-linked during the curing process after pattern-formation by irradiation and development. By this cross-linking, the properties of the resulting film can be greatly improved. The reactive end-cap group is introduced by adding a monomer having a reactive functional group, e.g., a monoamine or monoanhydride compound that has at least one carbon-carbon double bond, during the preparation of the soluble polyimide. Also, since the molecular weight of the soluble polyimide can be controlled within a desired range by adding the monomer having a reactive functional group, the optimization of the properties of the soluble polyimide can be more easily achieved and the viscosity of a final photosensitive polyimide precursor composition can be reduced. Furthermore, since cross-linking between reactive end-cap groups at the ends of the polymer chain occurs during the curing step, the molecular weight of the final film increases sharply and its physical and chemical properties, such as heat resistance, chemical resistance, mechanical strength, etc., can be improved greatly.

Examples of the monomer having a reactive functional group include 5norbornene-2,3-dicarboxylicanhydride (NDA), 3,4,5,6-tetrahydrophthalicanhydride, cis-1,2,3,6-tetrahydro phthalicanhydride, maleicanhydride (MA), 2,3-dimethyl maleicanhydride (DMMA), citraconicanhydride (CA), itaconicanhydride (IA) and ethynylaniline (EA). Preferably, the monomer having a reactive functional group is NDA, IA, or DMMA. The monomer having a reactive functional group is used alone or in combination with one or more kinds of the monomer described above.

The soluble polyimide of Formula 1 is prepared by reacting a tetracarboxylic dianhydride of the following Formula 2, a diamine of the following Formula 3 and a reactive end-cap group in the presence of a polar solvent such as N-methyl-2-pyrrolidone (NMP) at a temperature of 0 to 10° C. for 4 hours to obtain a polyamic acid, and heating and curing the polyamic acid at elevated temperature of 120 to 180° C. for 2 to 4 hours:

Formula 2

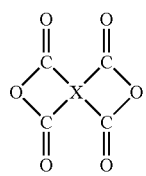

wherein, X is as defined above;

Formula 3

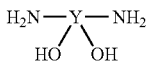

wherein, Y is as defined above.

The resulting soluble polyimide is reacted further with an appropriate compound capable of converting its hydroxyl groups into acetal groups so as to prepare a soluble polyimide partially substituted with an acetal group (see, Formula 1).

Examples of the dianhydride having Formula 2 include pyromellitic dianhydride, 3,3,4,4-biphenyl tetracarboxylic dianhydride, 4,4-oxydiphthalic dianhydride, 3,3',4,4'-benzophenone tetracarboxylic dianhydride, 2,2-bis(3,4-benzenedicarboxylic anhydride)perfluoropropane and 4,4-sulfonyldiphthalic dianhydride. Preferably, the dianhydride is pyromellitic dianhydride, 3,3,4,4-biphenyl tetracarboxylic dianhydride, or 4,4-oxydiphthalic dianhydride. The anhydride(s) is(are) used alone or in combination with one or more kinds of anhydrides.

Examples of the diamine having a Formula 3 include 1,3-diamino-4-dihydroxybenzene, 1,3-diamino-5-dihydroxybenzene, 3,3'-diamino-4,4'-dihydroxybiphenyl, 4,4'-diamino-3,3'-dihydroxybiphenyl, 2,2-bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, bis(3-amino-4-hydroxyphenyl)ether, bis(4-amino-3-hydroxyphenyl)ether, 2,2-bis(3-amino-4-hydroxyphenyl)hexafluoropropane, and 2,2-bis(3-amino-4-hydroxyphenyl) hexafluoropropane. Preferably, the diamine is 2,2-bis(3-amino-4-hydroxyphenyl) propane or 2,2-bis(3-amino-4-hydroxyphenyl) hexafluoropropane. The amine(s) is(are) used alone or in combination with one or more kinds of amines mentioned above.

Specific examples of the appropriate compound capable of converting hydroxyl groups of the soluble polyimide into acetal groups include chloromethylethylether and chloromethylmethylether. Also, examples for a solvent that may be used for preparing the soluble polyimide of the present invention include DMF, NMP and DMAc.

The present invention also provides a photosensitive polyimide precursor composition that includes the soluble polyimide of Formula 1 containing at least one reactive end-cap group at one or both ends of the polymer chain, a polyamic acid containing at least reactive end-cap group at one or both ends of the polymer chain, a photo acid generator (PAG) and a polar solvent.

The photosensitive polyimide precursor composition of the present invention comprises the soluble polyimide of Formula 1 containing at least one reactive end-cap group at one or both ends of the polymer chain. As described above, owing to the soluble polyimide, the precursor composition of the present invention exhibits good planarization characteristics upon coating. Also, when the composition is being subject to irradiation and development, the solubility of the exposed portion is increased dramatically while the non-exposed portion of the composition remains at the original lower solubility, and so the difference in solubility between the exposed and the non-exposed portions becomes larger and the larger difference facilitates obtaining a clear formation of a desired pattern. Further, when the obtained film is subject to a curing process, the presence of the soluble polyimide in the composition prevents the film from being excessively shrunken, thereby a conventional problem of positive-type photosensitive polyimides can be solved. Also, since the soluble polyimide dissolves very well in various solvents and is compatible with the polyamic acid, the preparation of the composition is achieved very easily.

In addition, the photosensitive polyimide precursor composition of the present invention further comprises a polyamic acid containing at least one reactive end-cap group at one or both ends of the polymer chain, represented by the following Formula 4:

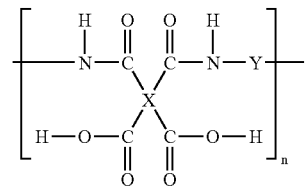

Formula 4 wherein
X is a tetravalent aromatic or aliphatic organic group;
Y is a tetravalent aromatic or aliphatic organic group; and
n is an integer of from about 10 to about 1000.

Specific examples of X and Y in the above Formula 4 are as previously defined above for Formula 1.

The polyamic acid contains, at one or both ends, one or more reactive end-cap group(s), which can be further cross-linked with the soluble polyimide, other polyamic acid or, if necessary, the dissolution inhibitor during a curing process after pattern-formation by irradiation and development. By this cross-linking, the properties of the resulting film can be greatly improved. During the preparation of the polyamic acid, the reactive end-cap group is introduced by adding a monomer having a reactive functional group, e.g., a monoamine or monoanhydride compound that has at least one carbon-carbon double bond. Also, since the molecular weight of the polyamic acid can be controlled within a desired range by adding the monomer having a reactive functional group, optimization of the properties of the polyamic acid can be achieved more easily and the viscosity of a final photosensitive composition can be reduced to a desired range with ease. Furthermore, since the cross-linkings between reactive end-cap groups at ends of the polymer chain during the curing step result in a sharp increase in the molecular weight of the final film polymer, physical and chemical properties of the film is greatly improved.

Examples of the monomer having a reactive end-cap group are same as previously described with respect to the Formula 1 compounds.

In the precursor composition according to the present invention, the polyamic acid in an exposed region can increase the dissolution rate and then can be converted into the polyimide during a subsequent curing step. Furthermore, the presence of the polyamic acid is believed to greatly improve transparency, adhesion, heat resistance, and chemical and mechanical stability of the cured film.

In particular, the inventors believe that when both the polyamic acid and the soluble polyimide contain reactive end-cap groups at both ends of their polymer chains, each polymer retains its intrinsic properties and the composition exhibits a proper dissolution rate, a high transparency (a degree of light penetration), a low viscosity until the pattern formation, while the reactive end-cap groups at both ends of their polymer chains are uniformly cross-linked during a curing step. Accordingly, the molecular weight of the final polymer of the film is considerably increased so that physical and chemical stability and mechanical properties of the final polymer film is improved greatly.

Also, since the photosensitive polyimide precursor composition of the present invention comprises both the soluble polyimide and the polyamic acid, it exhibits a high degree of UV light transmittance and a large difference between dissolution rates of an exposed portion and a non-exposed portion, which can reduce the required amount of the photo acid generator (PAG). Further, the photosensitive polyimide precursor composition facilitates the formation of a film having a desired thickness upon coating, and lowers film shrinkage during curing a film formed by exposure to light, followed by development.

In particular, when a siloxane repeating unit is incorporated into the polyamic acid, the adhesion of the composition to the substrate can be further enhanced. Specifically, in order to improve the adhesion of the composition to the substrate, Y in the above Formula 4 is substituted with a siloxane repeating unit represented by the following Formula 5:

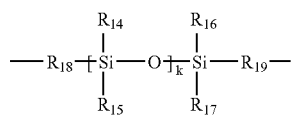

Formula 5 wherein
$R_{14}$, $R_{15}$, $R_{16}$ and $R_{17}$ are each independently an alkyl group, an aryl group, an alkoxy group or hydroxyl group;

Each of $R_{18}$ and $R_{19}$ is independently a divalent alkyl group or aryl group; and k is an integer of from about 1 to about 10.

The siloxane repeating unit is present in an amount of 1 to 50% based on the total repeating units of the polymer chain.

The polyamic acid of Formula 4 used for the photosensitive polyimide precursor composition according to the present invention is prepared by reacting a tetracarboxylic dianhydride of Formula 2, a diamine of Formula 3 and a reactive end-cap group monomer at a temperature of 0 to 10° C. for about 4 to 20 hours. In particular, the polyamic acid containing the siloxane unit for improving the adhesion to the substrate can be obtained using a polysiloxane diamine represented by the following Formula 6, as a comonomer in the polymerization of polyamic acid:

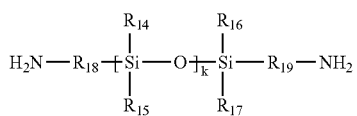

Formula 6 wherein
$R_{14}$ to $R_{19}$ are as defined in the above Formula 5; and
k is as defined in the above Formula 5.

In the photosensitive polyimide precursor composition according to the present invention, assuming that the weight of the soluble polyimide is "A" and the weight of the polyamic acid is "B", the weight ratio of the soluble polyimide to the total weight of the soluble polyimide and the polyamic acid (A/(A+B)) falls between 0.01 to 0.95 and preferably 0.2 to 0.6. Within this range, the degree of UV light transmittance, viscosity, dissolution rate of an exposed portion, film retentiveness at a non-exposed portion and the physical properties of a final polyimide film after curing can be controlled desirably.

The photosensitive polyimide precursor composition according to the present invention comprises a photo acid generator (PAG) as a photosensitive compound. Examples of the PAG used herein include common PAGs capable of generating an acid upon light irradiation, and preferably are non-ionic photo acid generators such as halogenides generating HX and sulfone compounds generating sulfonic acid; and ionic photo acid generators such as ammonium compounds, diazonium compounds, iodonium compounds, sulfonium compounds, phosphonium compounds, onium polymer compounds, selenium compounds and arsenium compounds.

More specifically, the non-ionic photo acid generators include diazonaphthoquinones (DNQ) represented by the following Formula 7:

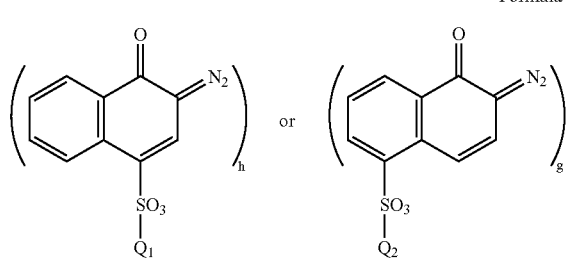

Formula 7 wherein,
$Q_1$ and $Q_2$ are each independently a monovalent to tetravalent alkyl group or aryl group; and h and g are each independently an integer of from 1 to 4;
and nitrobenzylsulfonates represented by the following Formula 8:

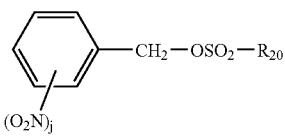

Formula 8 wherein
$R_{20}$ is an alkyl group, an aryl group, or an alkyl group or an aryl group containing a heteroatom; and j is an integer of from 1 to 3.

The ionic photo acid generators include sulfonium-based compounds such as $Ph_3S^+SbF_6^-$, $Ph_3S^+TosO^-$, $Ph_3S^+TfO^-$, etc; iodonium-based compounds such as $Ph_2I^+AsF_6^-$, $Ph_2I^+PF_6^-$, etc; arsenium-based compounds such as $RO-C_6H_4-N_2^+SbF_6^-$, etc; and aromatic sulfonic acid diphenyliodonium-based compounds represented by the following Formula 9:

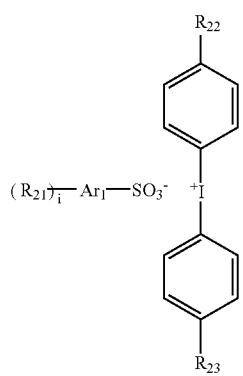

Formula 9 wherein
$R_{21}$, $R_{22}$ and $R_{23}$ are each independently an alkyl group, an aryl group or hydroxyl group;

$Ar_1$ is phenyl group, naphthalenyl group or anthracenyl group; and i is an integer of from 1 to 5.

Alternately, photo acid generators in the form of a polymer can be used in the present invention.

In the photosensitive polyimide precursor composition according to the present invention, the PAG(s) can be used alone or in combination with one or more kinds of PAGs.

In the photosensitive polyimide precursor composition according to the present invention, the amount of PAG used is within the range of 0.1~50 parts by weight, and more preferably 1~20 parts by weight, relative to 100 parts by weight of the total amount of the soluble polyimide and the polyamic acid. When the PAG is added in an amount of less than 0.1 parts by weight, photosensitivity of the composition can be poor. When the PAG is added in an amount of more than 50 parts by weight, the degree of UV light transmittance of the composition drops significantly and thus it is impossible to increase the thickness of film. Further, color and physical properties of the cured film can be poor.

Since the photosensitive polyimide precursor composition according to the present invention exhibits a considerable difference in solubility as compared to an aqueous alkaline solution in the presence of an acid, a pattern with high resolution can be easily obtained by using only a small amount of PAG.

The photosensitive polyimide precursor composition of the present invention can further comprise a dissolution inhibitor for controlling a dissolution rate during developing. Examples of the dissolution inhibitor used herein include those of the following Formulae 10 to 14:

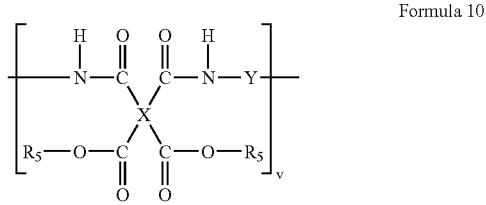

Formula 10 wherein $R_5$ is a hydrogen atom or a functional group capable of being dissociated by an acid (in which, assuming that the number of hydrogen atoms is "a" and the number of a functional groups capable of being dissociated by an acid is "b", b/(a+b) is within the range of 0.1 to 1, and preferably 0.5 to 0.8);

X is a tetravalent aromatic or aliphatic organic group;

Y is a tetravalent aromatic or aliphatic organic group; and v is an integer of from about 10 to about 1000,

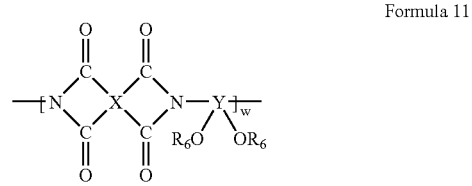

Formula 11 wherein $R_6$ is a hydrogen atom or a functional group capable of being dissociated by an acid (in which, assuming that "a" and "b" is defined as Formula 10, b/(a+b) is within the range of 0.1 to 1, and preferably, 0.1 to 0.5;

X is a tetravalent aromatic or aliphatic organic group;

Y is a tetravalent aromatic or aliphatic organic group; and w is an integer of from about 10 to about 1000,

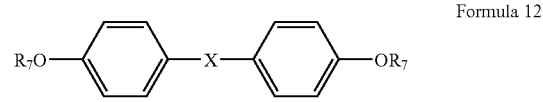

Formula 12 wherein $R_7$ is a hydrogen atom or a functional group capable of being dissociated by an acid (in which, assuming that "a" and "b" is defined as Formula 10, b/(a+b) is within the range of 0.1 to 1, and preferably, 0.6 to 1.0); and X is a divalent aromatic or aliphatic organic group, or a divalent aromatic or aliphatic organic group containing a heteroatom,

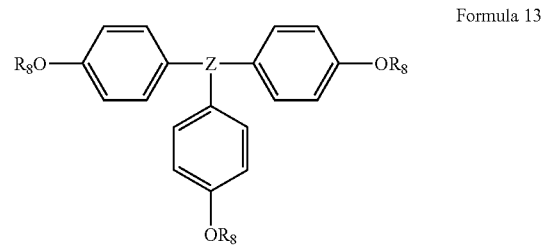

Formula 13 wherein $R_8$ is a hydrogen atom or a functional group capable of being dissociated by an acid (in which, assuming that "a" and "b" is defined as Formula 10, b/(a+b) is within the range of 0.1 to 1, and preferably, 0.6 to 1.0); and Z is a trivalent aromatic or aliphatic organic group, or a trivalent aromatic or aliphatic organic group containing a heteroatom,

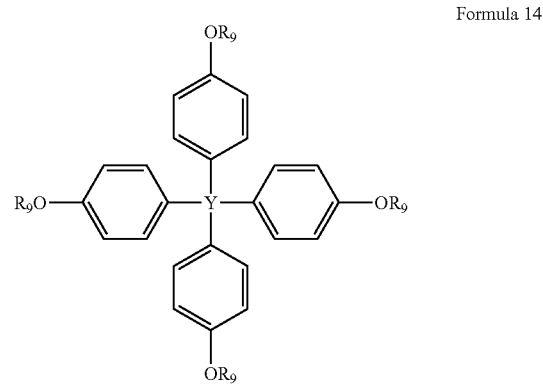

Formula 14 wherein $R_9$ is a hydrogen atom or a functional group capable of being dissociated by an acid (in which, assuming that "a" and "b" is defined as Formula 10, b/(a+b) is within the range of 0.1 to 1, and preferably, 0.6 to 1.0); and Y is a tetravalent aromatic or aliphatic organic group, or a tetravalent aromatic or aliphatic organic group containing a heteroatom.

The functional group capable of being dissociated by an acid in $R_5$, $R_6$, $R_7$, $R_8$ and $R_9$ includes —$CHR_{12}$—O—$R_{13}$ (in which $R_{12}$ and $R_{13}$ are each independently a saturated or unsaturated hydrocarbon or aromatic organic group having 1 to 20 carbon atoms and $R_{12}$ and $R_{13}$ may be joined with each other to form a cyclic compound), trimethylsilyl group, tert-butyl group, menthyl group, isobornyl group, 2-methyl-2-adamantyl group, dicyclopropylmethyl (Dcpm) group, dimethylcyclo propyl methyl (Dmcp) group or groups represented by the following Formulae:

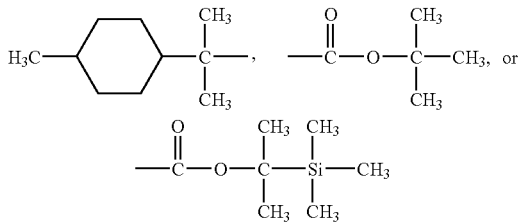

In the dissolution inhibitor, by varying the values of a/(a+b) in $R_5$, $R_6$, $R_7$, $R_8$ and $R_9$, the dissolution rate of a film during development can be controlled.

Among the dissolution inhibitors, the hydrogens of the carboxylic group in polyamic acid ester of Formula 10 are substituted with a functional group capable of being dissociated by an acid. Upon irradiation, the functional group is converted into hydrogen in the presence of the acid generated by irradiation so the additional difference in solubility is brought about.

Among the above dissolution inhibitors, the dissolution inhibitors of Formula 10 and 11 can contain at least one reactive end-cap group at one or both ends of their polymer chains. The reactive end-cap group is as previously described.

In the photosensitive polyimide precursor composition according to the present invention, the dissolution inhibitors can be used alone or in combination. The amount of the dissolution inhibitor added is within the range of 0.05 to 50 parts by weight and preferably 0.1 to 30 parts by weight, relative to 100 parts by weight of the total amount of the soluble polyimide and the polyamic acid. When the dissolution inhibitor is added in an amount of less than 0.05 parts by weight, film retentiveness of a non-exposed portion decreases. When the dissolution inhibitor is added in an amount of more than 50 parts by weight, color of the cured film becomes poor.

The photosensitive polyimide precursor composition of the present invention is prepared by dissolving the soluble polyimide, the polyamic acid, the photo acid generator (PAG) and optionally the dissolution inhibitor in a polar solvent. The solid content of the composition, i.e. total content of the soluble polyimide, the polyamic acid and the photo acid generator (PAG), is determined by the thickness of film to be produced. In general, the solid content of the composition is preferably within the range of 5 to 50% by weight, based on the total weight of the composition. A mixture of the soluble polyimide and the polyamic acid accounts for 80% or more by weight, relative to the solid content. When solid content is above 50% by weight, the composition is highly viscous, which makes a process such as spin coating difficult.

Examples of the polar solvent used herein include N-methyl-2-pyrrolidone, N,N'-dimethylacetoamide, dimethylformamide, dimethyl sulfoxide, acetonitrile, diglyme, γ-butyrolactone, phenol, cyclohexanone, toluene and cyclohexane. N-methyl-2-pyrrolidone (NMP) and γ-butyrolactone are particularly preferred.

The photosensitive polyimide precursor composition according to the present invention can further comprise other additives such as sensitizers, adhesiveness promoters, etc.

The photosensitive polyimide precursor composition according to the present invention is positive-type, which uses an environmentally friendly and economical aqueous alkaline solution as a developing solution. Examples of the aqueous alkaline solution usable herein as a developing solution include aqueous solutions of quaternary ammonium hydroxides such as tetramethylammoniumhydroxide, tetraethylammoniumhydroxide, etc; and aqueous solutions of amines such as ethanolamine, propylamine, etc. The aqueous tetramethylammoniumhydroxide (TMAH) solution is preferred.

The use of the photosensitive polyimide precursor composition according to the present invention facilitates the formation of a patterned heat resistant polyimide film on a substrate such as a glass plate or a silicon wafer, etc. The coating of the composition onto the substrate can be carried out using spin coating, bar coating, screen-printing, etc. The thickness of the coated film is 0.5 to 20 μm. The composition according to the present invention is able to form a thicker film than conventional polyimide-based resists. After coating, the coated film is subjected to pre-baking at a temperature of 50 to 150° C. for about 4 to 15 minutes to volatilize the solvent and form a pre-baked film that is then UV-irradiated under a photo mask having a predetermined pattern. Light source for UV-irradiation has a wavelength of 365 nm and, exposure energy ranges from 100 to 3,000 mJ/cm$^2$. After exposure, a post exposure baking (PEB) process is performed at a temperature of 50 to 150° C. for 10 to 600 seconds. At this process, in an exposed portion, an acid generated from the PAG displaces a protecting group (e.g., acetal group) from the soluble polyimide or the dissolution inhibitor. As a result, the dissolution rate of the photosensitive polyimide in an exposed area in an alkaline developing solution is considerably increased, when compared with that of a non-exposed portion, and based on the difference between dissolution rates of the exposed and the non-exposed portion, the exposed portion is removed by the developing solution to form a desired pattern. After development, the formed pattern is rinsed with distilled water or alcohols, and then dried. In general, the resolving power of the photosensitive polyimide is expressed by an aspect ratio (d/w), a ratio of a line width (w) to thickness (d). The photosensitive polyimide precursor composition of the present invention can form a high-resolution pattern having an aspect ratio of above 3.0, that is, in the case where the film thickness is 15 μm, the minimum line width is 5 μm. This is because the composition exhibits a high degree of light penetration and a large difference between dissolution rates of the exposed and the non-exposed portion. The pattern thus formed is converted into a final polyimide film having a desired pattern through heat-treatment. The heat-treatment (i.e. a curing) is performed continuously or on a step basis at a temperature of 100 to 450° C. under vacuum or nitrogen atmosphere for 0.5 to 5 hours. At this curing process, substituents in the dissolution inhibitor and the polyimide are thermally decomposed and then evaporated off. Also, at this process, the polyamic acid is imidized and cross-linking takes place between reactive blocking groups at one or both ends of the chains of the soluble polyimide and polyamic acid, thereby considerably increasing the molecular weight of a final film polymer.

The final polyimide film has high $T_g$ and $T_d$, and has an excellent strength, modulus, elongation, thermal expansion coefficient, insulation property, hygroscopic property, etc. The polyimide film produced by the present invention can be used as insulting films or protective films for various electronic devices, e.g., interlayer insulating films, buffer coating films and passivation films for semiconductor devices, insulating films for multilayered PCBs, etc.

Hereinafter, the present invention will be described in more detail with reference to the following Examples. However, these Examples are provided only for illustrative purposes, and are not to be construed as limiting the scope of the present invention.

EXAMPLES

Example 1

Synthesis of Soluble Polyimide Resin 2,2-bis(3-amino-4-hydroxyphenyl)hexafluoropropane (36.63 g ) and 200 g of N-methyl-2-pyrrolidone (NMP) were sequentially charged into a 1 L round-bottom flask. The mixture was stirred until it was completely dissolved. While maintaining the flask at 0-5° C., 39.98 g of 2,2-bis(3,4-benzenedicarboxylic anhydride) perfluoropropane and 3.28 g of 5-norbornene-2,3-dicarboxylic anhydride (NDA) were added to the mixture. After the resulting mixture was stirred at room temperature for 16 hours, 40 g of toluene was added to the flask. Using a Dean-Stark distillation equipment, the reaction solution was refluxed at 170° C. for 3 hours to complete the reaction. The reaction solution thus prepared was allowed to cool to room temperature, and slowly poured into a 1:4 methanol-water mixture to obtain precipitates. The precipitates were filtered and dried in a vacuum drying oven at 40° C. for 24 hours to obtain 80 g of a soluble polyimide resin. Resin (20 g) thus obtained in powder form was charged into a 1 L round-bottom flask and dissolved in 100 g of N-methyl-2-pyrrolidone (NMP). The resulting solution was cooled on ice and then 2.73 g of triethylamine (TEA) was added thereto, with maintaining the temperature at 0~5° C. After stirring for 10 minutes, 2.84 g of chloromethylethylether was slowly added to the solution. After the resulting solution was stirred for 3 hours while maintaining at low temperature, triethylammonium chloride salt was filtered off. The filtrate was slowly poured into a 1:2 methanol-distilled water mixture with vigorous stirring to form precipitates as a fine white solid. The precipitates thus formed were filtered and collected, washed with distilled water, and dried in a vacuum oven at 40° C. for 36 hours to prepare 20 g of a soluble polyimide represented by the following Formula, as a white powder:

2) Synthesis of Polyamic Acid 4,4'-diaminodiphenylether (ODA) (40.05 g) and 239 g of NMP were sequentially charged into a 1 L round-bottom jacket reactor. The mixture was slowly stirred until it was completely dissolved. While maintaining the solution at 20° C., 55.8 g of ODPA (4,4'-oxydiphthalic anhydride) was slowly added to the solution and then stirred and dissolved. After the resulting solution was further stirred for 2 hours in order to react it sufficiently, 6.57 g of NDA was added thereto and then stirred at room temperature for 16 hours to prepare a polyamic acid as a solution.

3) Synthesis of Dissolution Inhibitor 1,4-bis(4-aminophenoxy)benzene (BAPB) (3.51 g), 9.61 g of 4,4'-diaminodiphenylether (ODA) and 140 g of NMP were sequentially charged into a 1 L round-bottom flask. The mixture was stirred until it was completely dissolved. While maintaining the mixture at room temperature, 1.18 g of pyromellitic dianhydride (PMDA) and 9.73 g of 4,4'-oxydiphthalic anhydride (ODPA) were added thereto slowly and then stirred. After the resulting mixture was further stirred for 2 hours in order to react it sufficiently, 0.98 g of NDA and 0.67 g of itaconic anhydride (IA) were added thereto and then stirred at room temperature for 16 hours. Thereafter, while maintaining the temperature of the flask at −20° C., 50 ml of NMP was added to dilute the mixed solution and then 7.26 g of TEA diluted in 30 ml of NMP was slowly added thereto and stirred. After the addition, the resulting mixture was further stirred for 10 minutes so that TEA was uniformly mixed, and then 7.18 g of chloromethylethylether (CME) diluted in 30 ml of NMP was slowly added thereto. The reaction mixture was stirred at −20° C. for 2 hours. While maintaining the reaction mixture at 0-10° C., triethylammonium chloride salt was filtered off. The filtrate was poured into a solution of a 1:2 methanol-distilled water mixture with vigorous stirring to form precipitates as a fine white solid. The precipitates were filtered, rinsed with distilled water, and dried in a vacuum oven at 40° C. for 36 hours to prepare 25 g of a polyamic acid ester as a white powder.

4) Preparation of Positive-type Photosensitive Polyimide Composition

First, 1.8 g of the soluble polyimide prepared in the above 1) was dissolved in 14 g of a solution of the polyamic acid (solid content: 30%) prepared in the above 2). To the solution, 0.2 g of the polyamic acid ester prepared in the above 3) as a dissolution inhibitor and 0.45 g of hydroxynaphthalene sulfonic acid diphenyliodonium as a photo acid generator were added. The resulting mixture was passed through a filter (0.1 μm) to prepare a photosensitive polyimide composition.

5) Resolution Evaluation

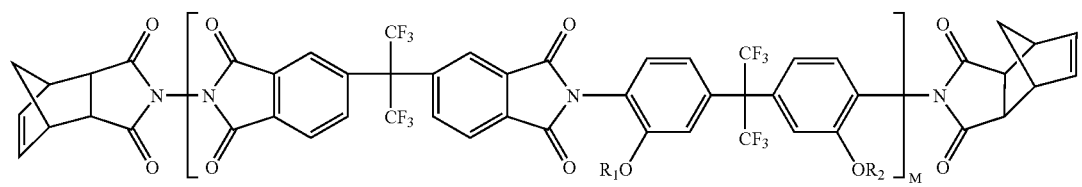

wherein M was a number of 100 to 200, $R_1$ and $R_2$ is hydrogen or —$CH_2$—$OCH_2CH_3$ and the proportion of acetal group among $R_1$ and $R_2$ is 90 to 95%.

The photosensitive polyimide composition prepared in the above 4) was spin-coated on a 4-inch silicon wafer and heated on a hot plate at 90° C. for 4 minutes to obtain a photosensitive polyimide precursor film having a thickness of 15 μm. The silicon wafer coated with the photosensitive polyimide composition was adhered to a photomask under vacuum, and then was exposed to ultraviolet light (wavelength: 365 nm) from a high-pressure mercury lamp with exposure energy of 1000 mJ/cm². After the exposure, the silicon wafer was subjected to a post expose baking (PEB) on a hot plate at 125° C. for 3 minutes, developed with an aqueous solution containing 2.38% by weight of tetramethylammoniumhydroxide (TMAH) for 3 minutes to remove an exposed portion, and rinsed with distilled water to obtain a definite pattern on the silicon wafer. The silicon wafer with the pattern was heat-treated on a hot plate under nitrogen atmosphere at elevated temperatures (starting at room temperature, at 180° C. for 60 minutes and at 300° C. for 60 minutes) to produce a film having a thickness of 10 μm and a minimum line width of 5 μm.

6) Evaluation of Physical Properties of the Film

The photosensitive polyimide composition prepared in the above 4) was spin-coated on a glass plate, and was heat-treated on a hot plate at 180° C. under nitrogen atmosphere for 60 minutes and 300° C. for 60 minutes, sequentially, to obtain a polyimide film having a thickness of 10 μm. The polyimide film was subjected to PCT (pressure cooking treatment) process in an autoclave at 125° C. and 2.3 atm for 30 minutes and the film was peeled from the glass plate. The peeled polyimide film was cut to obtain a test piece having a width of 1 cm and a length of 3 cm. The test piece was shown to have a tensile strength of 160 Mpa, a modulus of 3.0 GPa and an elongation of 19%.

Example 2

Synthesis of Soluble Polyimide Resin:

2,2-bis(3-amino-4-hydroxyphenyl)hexafluoropropane (25.64 g) and 150 g of N-methyl-2-pyrrolidone (NMP) were sequentially charged into a 1 L round-bottom flask. The mixture was stirred until it was completely dissolved. While maintaining the flask at room temperature, 19.54 g of ODPA (4,4'-osydiphthalic anhydride) was added slowly. After the resulting mixture was stirred at room temperature for 2 hours, 1.37 g of maleic anhydride was added to the flask. After the resulting mixture was stirred at room temperature for 16 hours, 30 g of toluene was added to the flask. Using a Dean-Stark distillation equipment, the reaction solution was refluxed at 170° C. for 3 hours to complete the reaction. The reaction solution thus prepared was allowed to cool to room temperature, and slowly poured into a 1:4 methanol-water mixture to obtain precipitates. The precipitates were filtered and dried in a vacuum drying oven at 40° C. for one day to obtain 45 g of white resin powder(i.e. soluble polyimide). 19.6 g of the resin thus obtained in a powder form was charged into a 1 L round-bottom flask and dissolved in 100 g of N-methyl-2-pyrrolidone (NMP). The resulting solution was cooled on ice and then 2.12 g of triethylamine (TEA) was added thereto, maintaining the temperature at 0~5° C. After stirring for 10 minutes, 2.27 g of chloromethylethylether was slowly added to the solution. After the resulting solution was stirred for 3 hours while maintaining at low temperature, triethylammonium chloride salt was filtered off. The filtrate was slowly poured into a 1:2 methanol-distilled water mixture with vigorous stirring to form precipitates as a fine white solid. The precipitates thus formed were filtered and collected, washed with distilled water, and dried in a vacuum oven at 40° C. for 36 hours to prepare 21 g of a soluble polyimide represented by the following Formula, as a white powder:

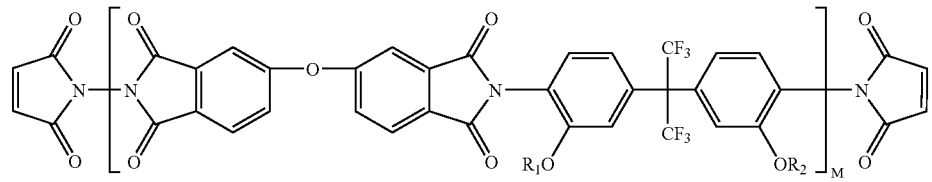

wherein M was a number between 100 to 200, $R_1$ and $R_2$ is hydrogen or —$CH_2$—$OCH_2CH_3$, and the proportion of acetal group among $R_1$ and $R_2$ is 75 to 80%.

Figure 3:
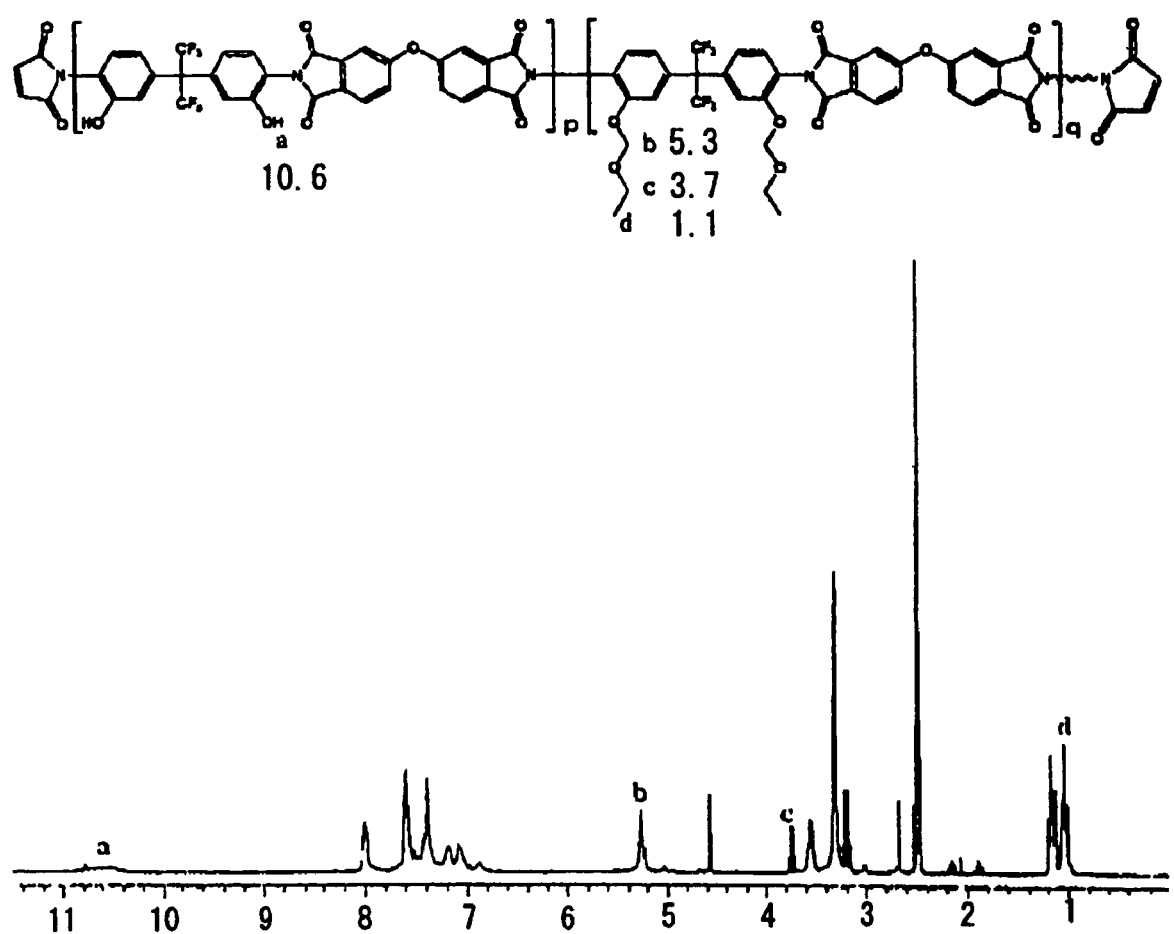
FIG. 3 is a $^1$H-NMR spectrum of a soluble polyimide prepared in Example 2.

Referring to $H^1$-NMR spectrum shown in FIG. 3, due to the introduction of acetal group (—$CH_2$—$OCH_2CH_3$), the hydrogen peak at 10.6 ppm (a) was remarkably reduced and the hydrogen of $CH_2$ and $CH_3$ in acetal group was confirmed at 1.1 ppm, 3.7 ppm and 5.3 ppm (d, c, and b, respectively).

2) Preparation of Polyamic Acid 1,3-bis(3-aminopropyl)(tetramethyldisiloxane (siloxane diamine: SDA) (2.4 g), 37.3 g of 4,4'-diaminodiphenylether (ODA) and 235 g of NMP were sequentially charged into a 1 L round-bottom jacket reactor. The mixture was slowly stirred until it was completely dissolved. After the resulting solution was further stirred for 2 hours in order to react it sufficiently, 5.2 g of 2,3dimethyl maleic anhydride(DMMA) was slowly added thereto and then stirred at room temperature for 16 hours to prepare a polyamic acid as a solution.

3) Synthesis of Dissolution Inhibitor 2,2-bis(3-amino-4-hydroxyphenyl)hexafluoropropan (25.64 g ) and 100 g of NMP were sequentially charged into a 1 L flask. The mixture was stirred until it was completely dissolved. While maintaining the mixture at room temperature, 6.86 g of maleic anhydride and 10.85 g of ODPA were added thereto. After the resulting mixture was stirred at room temperature for 16 hours, 40 g of toluene was added to the flask. Using a Dean-Stark distillation equipment, the reaction solution was refluxed at 170° C. for 3 hours to react. The reaction solution thus prepared was allowed to cool to room temperature, and slowly poured into a 1:4 methanol-water mixture to obtain precipitates. The precipitates were filtered and dried in a vacuum drying oven at 40° C. for one day to obtain 40 g of white resin powder (i.e. soluble polyimide). 10 g of the dried polyimide resin thus obtained was charged into a 500 ml 3-neck flask and dissolved in 100 ml of tetrahydrofurane (THF). 2.1 g of triethylamine (TEA) was added thereto and stirred for 20 min. When the reaction mixture was cooled sufficiently in a ice bath, 2.2 g of trimethylsilyl chloride($Me_3SiCl$) was dropwise added slowly. After stirring for 2 hours while elevating temperature from 0° C. to room temperature, white salt of triethylammonium chloride was filtered off. The filtrate was poured into a 1:4 methanol/water mixture with vigorous stirring to form precipitates as a fine white solid. The precipitates were filtered, rinsed with distilled water, and dried in a vacuum oven at 40° C. for 36 hours to prepare the dissolution inhibitor.

4) Preparation of Positive-type Photosensitive Polyimide Composition

First, 5 g of the soluble polyimide prepared in the above 1) was dissolved in 14 g of a solution of the polyamic acid (solid content: 30%) prepared in the above 2). To the solution, 1 g of the dissolution inhibitor prepared in the above 3) as a dissolution inhibitor, 0.6 g of bisphenolA and 0.9 g of diethoxyanthracene sulfonic acid diphenyliodonium salt were added. After dissolution, the resulting solution was passed through a filter (0.1 µm) to prepare a photosensitive polyimide composition.

5) Resolution Evaluation

The photosensitive polyimide composition prepared in the above 4) was spin-coated on a 4-inch silicon wafer and heated on a hot plate at 90° C. for 4 minutes to obtain a photosensitive polyimide precursor film having a thickness of 15 µm. The silicon wafer coated with the photosensitive polyimide composition was adhered to a photomask under vacuum, and then was exposed to ultraviolet light (wavelength: 365 nm) from a high pressure mercury lamp with exposure energy of 1000 mJ/cm². After the exposure, the silicon wafer was subjected to a post expose baking (PEB) on a hot plate at 125° C. for 3 minutes, developed with an aqueous solution containing 2.38% by weight of tetramethylammoniumhydroxide (TMAH) for 3 minutes to remove an exposed portion, and rinsed with distilled water to obtain a definite pattern on the silicon wafer. The silicon wafer with the pattern was heat-treated on a hot plate under nitrogen atmosphere at elevated temperatures (starting at room temperature, at 180° C. for 60 minutes and at 300° C. for 60 minutes) to produce a film having a thickness of 10 µm and a minimum line width of 7 µm.

6) Evaluation of Physical Properties of the Film

The photosensitive polyimide composition prepared in the above 4) was spin-coated on a wafer, and was heat-treated on a hot plate at 180° C. under nitrogen atmosphere for 60 minutes and 300° C. for 60 minutes, sequentially, to obtain a polyimide film having a thickness of 10 µm. The cured film was peeled from the wafer by soaking it in aqueous solution of HF(2%) for 30 min. The peeled film of polyimide was cut to obtain a test piece having a width of 1 cm and a length of 8 cm, which was subject to tensile test. The results were as follows: tensile strength of 156 Mpa, a modulus of 3.2 GPa and an elongation of 27%.

Example 3

Synthesis of Soluble Polyimide Resin:

3,3'-diamino-4,4'-dihydroxybiphenyl (13.0 g) and 74.2 g of NMP were sequentially charged into a 1 L round-bottom flask. The mixture was stirred until it was completely dissolved. While maintaining the flask at room temperature, 14.9 g of ODPA was added slowly. After the resulting mixture was stirred at room temperature for 2 hours, 3.9 g of NDA was added to the flask. After the resulting mixture was stirred at room temperature for 16 hours, 16 g of toluene was added to the flask. Using a Dean-Stark distillation equipment, the reaction solution was refluxed at 140° C. for 3 hours to complete the reaction. The reaction solution thus prepared was allowed to cool to room temperature, and slowly poured into a 1:4 methanol-water mixture to obtain precipitates. The precipitates were filtered and dried in a vacuum drying oven at 40° C. for one day. 19.6 g of the soluble polyimide resin thus obtained in a powder form was charged into a 1 L round-bottom flask and dissolved in 100 g of N-methyl-2-pyrrolidone (NMP). The resulting solution was cooled on ice and then 2.12 g of triethylamine (TEA) was added thereto, maintaining the temperature at 0~5° C. After stirring for 10 minutes, 2.27 g of chloromethylethylether was slowly added to the solution. After the resulting solution was stirred for 3 hours while maintaining it at a low temperature, triethylammonium chloride salt was filtered off. The filtrate was slowly poured into a 1:2 methanol-distilled water mixture with vigorous stirring to form precipitates as a fine white solid. The precipitates thus formed were collected, washed with 5 L of distilled water, and dried in a vacuum oven at 40° C. for 36 hours to prepare 21 g of a soluble polyimide as a white powder.

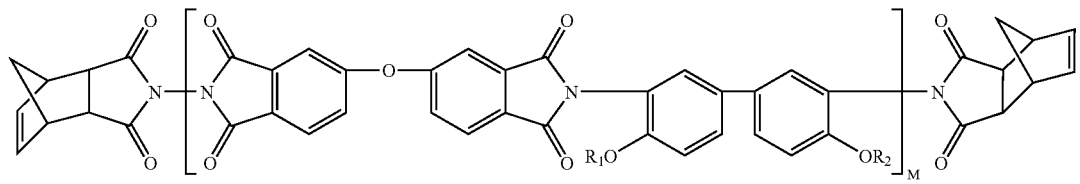

wherein M was a number of 100 to 200 and $R_1$ and $R_2$ is hydrogen or —$CH_2$—$OCH_2CH_3$ and the proportion of acetal group among $R_1$ and $R_2$ is 75 to 80%.

2) Synthesis of Polyamic Acid

ODA (26.7 g) and 158 g of NMP were sequentially charged into a 1 L round-bottom jacket reactor. The mixture was slowly stirred until it was completely dissolved. Then, 33.1 g of ODPA was slowly added while maintaining the jacket temperature of reactor at 20° C. After the resulting solution was further stirred for 2 hours in order to react it sufficiently, 3.4 g of DMMA and 4.4 g of NDA were slowly added thereto and then stirred at room temperature for 16 hours to prepare a polyamic acid as a solution.

3) Synthesis of Dissolution Inhibitor tris(hydroxyphenyl)ethane (7.7 g) was charged into a 500 ml 3-neck flask and dissolved in 100 ml of tetrahydrofurane (THF). 5.1 g of triethylamine (TEA) was added thereto and stirred for 20 min. When the reaction mixture was cooled sufficiently on ice, 10.9 g of trimethylsilyl chloride ($Me_3SiCl$) was added slowly in a dropwise manner. After stirring for 2 hours while elevating temperature from 0° C. to room temperature, white salt of triethylammonium chloride was filtered off. The filtrate was poured into a 1:4 methanol/water mixture with vigorous stirring to form precipitates as a fine white solid. The precipitates were filtered, rinsed with distilled water, and dried in a vacuum oven at 40° C. for 36 hours to obtain the dissolution inhibitor.

4) Preparation of Positive-type Photosensitive Polyimide Composition

First, 5 g of the soluble polyimide prepared in the above 1) was dissolved in 14 g of a solution of the polyamic acid (solid content: 30%) prepared in the above 2). To the solution, 0.6 g of the dissolution inhibitor prepared in the above 3) as a dissolution inhibitor, 0.3 g of diphenylsolfone and 0.6 g of triarylsulfonium p-toluenesulfonic acid salt were added. After dissolution, the resulting solution was passed through a filter (0.1 μm) to prepare a photosensitive polyimide composition.

5) Resolution Evaluation

The photosensitive polyimide composition prepared in the above 4) was spin-coated on a 4-inch silicon wafer and heated on a hot plate at 90° C. for 4 minutes to obtain a photosensitive polyimide precursor film having a thickness of 15 μm. The silicon wafer coated with the photosensitive polyimide composition was adhered to a photomask under vacuum, and then was exposed to ultraviolet light (wavelength: 350 nm–450 nm) from a high pressure mercury lamp without filter. The exposure energy was 1000 mJ/cm². After the exposure, the silicon wafer was subjected to a post expose baking (PEB) on a hot plate at 125° C. for 3 minutes, developed with an aqueous solution containing 2.38% by weight of tetramethylammoniumhydroxide (TMAH) for 3 minutes to remove an exposed portion, and rinsed with distilled water to obtain a definite pattern on the silicon wafer. The silicon wafer with pattern was heat-treated on a hot plate under nitrogen atmosphere at elevated temperatures (starting at room temperature, at 180° C. for 60 minutes and at 300° C. for 60 minutes) to produce a film having a thickness of 10 μm and a minimum line width of 7 μm.

6) Evaluation of Physical Properties of the Film

The photosensitive polyimide composition prepared in the above 4) was spin-coated on a wafer, and was heat-treated on a hot plate at 180° C. under nitrogen atmosphere for 60 minutes and 300° C. for 60 minutes, sequentially, to obtain a polyimide film having a thickness of 10 μm. The cured film was peeled from the wafer by soaking it in aqueous solution of HF(2%) for 30 min. The peeled polyimide film was cut to obtain a test piece having a width of 1 cm and a length of 8 cm, which was subject to tensile test. The results were as follows: tensile strength of 162 Mpa, a modulus of 3.1 GPa and an elongation of 29%.

Since the polyimide film of the present invention exhibits excellent thermal, electric and mechanical properties, it can be used as insulating films or protective films for various electronic devices, e.g., interlayer insulating films, buffer coating films and passivation films for semiconductor devices, insulating films for multi-layered PCBs, etc. Further, according to the present invention, a pattern with a high resolution can be formed even on the polyamide film having a thickness of above 10 μm. Therefore, the polyamide film of the present invention can be used for high level of integration in semiconductors and packaging.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A soluble polyimide comprising at least one reactive end-cap group at one or both ends of the polymer chain, the soluble polyimide represented by the following Formula 1:

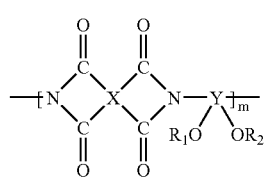

Formula 1 wherein:
X is a tetravalent aromatic or aliphatic organic group,
Y is a tetravalent aromatic or aliphatic organic group,
each of $R_1$ and $R_2$ is independently a monovalent organic group of H or $CH_2OR_3$ (in which $R_3$ is an alkyl group having not more than 6 carbon atoms), and with the proviso that both $R_1$ and $R_2$ are not H, and
m is an integer of from about 10 to about 1000, in which the reactive end-cap group is derived from a monoamine or monoanhydride compound that has at least one carbon-carbon double bond.

2. The soluble polyimide as claimed in claim 1, in which the X is selected from the group consisting of the following:

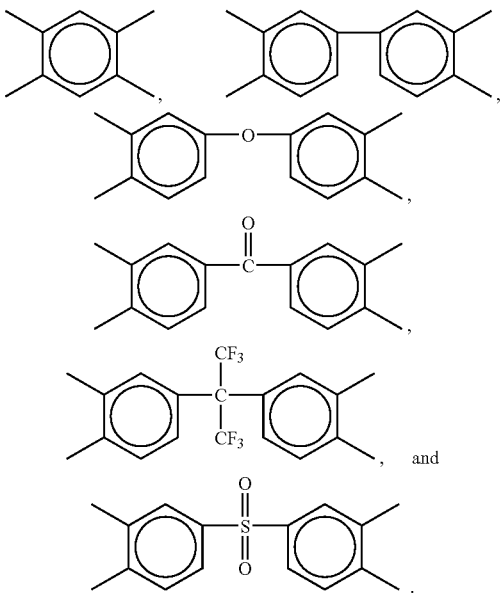

3. The soluble polyimide as claimed in claim 1, in which the

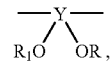

is selected from the group consisting of the following:

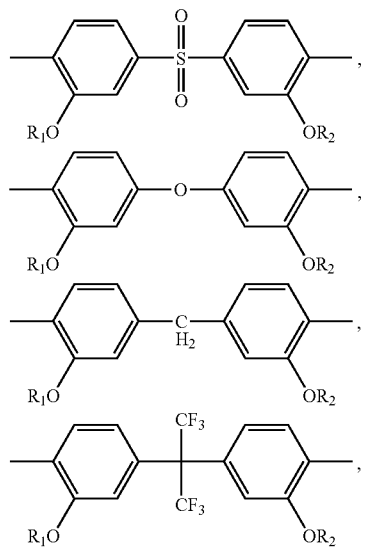

-continued

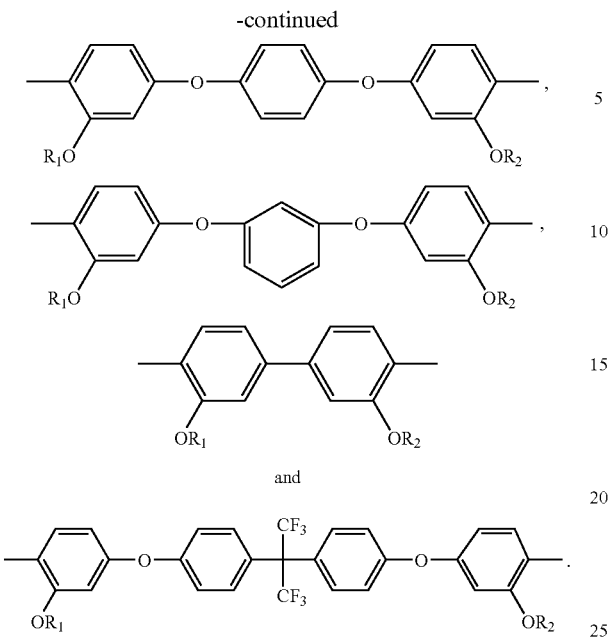

4. The soluble polyimide as claimed in claim 1, in which 5% to 95% of a total of the $R_1$ and $R_2$ in the soluble polyimide are $CH_2OR_3$.

5. A soluble polyimide comprising at least one reactive end-cap group at one or both ends of the polymer chain, the soluble polyimide represented by the following Formula 1:

Formula 1

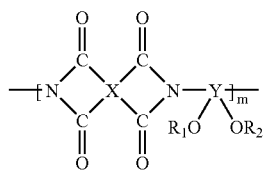

wherein:
X is a tetravalent aromatic or aliphatic organic group,
Y is a tetravalent aromatic or aliphatic organic group,
each of $R_1$ and $R_2$ is independently a monovalent organic group of H or $CH_2OR_3$ (in which $R_3$ is an alkyl group having not more than 6 carbon atoms), and with the proviso that both $R_1$ and $R_2$ are not H, and
m is an integer of from about 10 to about 1000, in which the reactive end-cap group is introduce by one or more compound(s) selected from the group consisting of 5-norbornene-2,3-dicarboxylicanhydride (NDA), 3,4,5,6-tetrahydrophthalicanhydride, cis-1,2,3,6-tetrahydrophthalicanhydride, maleicanhydride (MA), 2,3-dimethylmaleicanhydride (DMMA), citraconicanhydride (CA), itaconicanhydride (IA) and ethynylaniline (EA).

6. A photosensitive polyimide precursor composition comprising:
a soluble polyimide, the soluble polyimide including at least one reactive end-cap group at one or both ends of the polymer chain, represented by the following Formula 1:

Formula 1

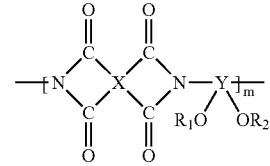

wherein:
X is a tetravalent aromatic or aliphatic organic group,
Y is a tetravalent aromatic or aliphatic organic group,
each of $R_1$ and $R_2$ is independently a monovalent organic group of H or $CH_2OR_3$ (in which $R_3$ is an alkyl group having not more than 6 carbon atoms), and with the proviso that both $R_1$ and $R_2$ are not H, and
m is an integer of from about 10 to about 1000; a polyamic acid being represented by the following Formula 4 and containing at least one reactive end-cap group at one or both ends of the polymer chain:

Formula 4

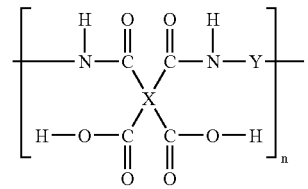

wherein:
X is a tetravalent aromatic or aliphatic organic group,
Y is a divalent aromatic or aliphatic organic group, and
n is an integer of from about 10 to about 1000;
a Photo Acid Generator; and
a polar solvent.

7. The composition as claimed in claim 6, further comprising one or more dissolution inhibitor(s) selected from the group consisting of the compounds represented by the following Formulae 10, 11, 12, 13 and 14:

Formula 10

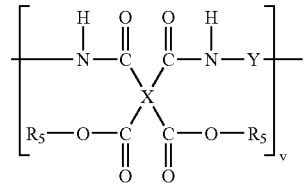

wherein:
$R_5$ is a hydrogen atom or a functional group capable of being dissociated by an acid (in which, assuming that the number of hydrogen atoms is "a" and the number of a functional groups capable of being dissociated by an acid is "b", b/(a+b) is within the range of 0.1 to 1),
X is a tetravalent aromatic or aliphatic organic group,
Y is a tetravalent aromatic or aliphatic organic group, and
v is an integer of from about 10 to about 1000;

Formula 11

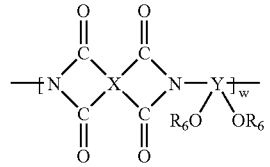

wherein:
- $R_6$ is a hydrogen atom or a functional group capable of being dissociated by an acid (in which, assuming that "a" and "b" are defined as in Formula 10, b/(a+b) is within the range of 0.1 to 1),
- X is a tetravalent aromatic or aliphatic organic group,
- Y is a tetravalent aromatic or aliphatic organic group, and
- w is an integer of from about 10 to about 1000;

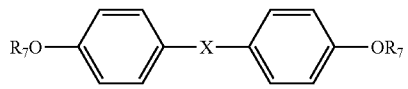

Formula 12 wherein:
- $R_7$ is a hydrogen atom or a functional group capable of being dissociated by an acid (in which, assuming that "a" and "b" are defined as in Formula 10, b/(a+b) is within the range of 0.1 to 1), and
- X is a divalent aromatic or aliphatic organic group, or a divalent aromatic or aliphatic organic group containing a heteroatom;

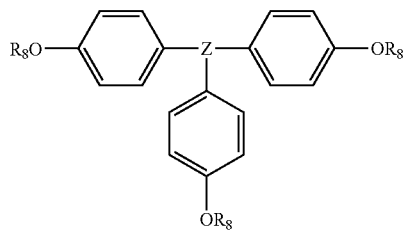

Formula 13 wherein:
- $R_8$ is a hydrogen atom or a functional group capable of being dissociated by an acid (in which, assuming that "a" and "b" are defined as in Formula 10, b/(a+b) is within the range of 0.1 to 1), and
- Z is a trivalent aromatic or aliphatic organic group, or a trivalent aromatic or aliphatic organic group containing a heteroatom; and

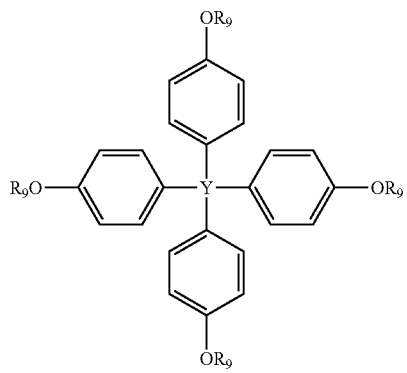

Formula 14 wherein:
- $R_9$ is a hydrogen atom or a functional group capable of being dissociated by an acid (in which, assuming that "a" and "b" are defined as in Formula 10, b/(a+b) is within the range of 0.1 to 1), and
- Y is a tetravalent aromatic or aliphatic organic group, or a tetravalent aromatic or aliphatic organic group containing a heteroatom.

8. The composition as claimed in claim 7, in which the dissolution inhibitor contains, at one or both end(s), at least one reactive end-cap group derived from a monoamine or monoanhydride compound that has at least one carbon-carbon double bond.

9. The composition as claimed in claim 7, wherein the functional group capable of being dissociated by an acid in the dissolution inhibitors of Formulae 10, 11, 12, 13 and 14 is selected from the group consisting of: a —$CHR_{12}$—O—$R_{13}$ group (in which each of $R_{12}$ and $R_{13}$ is independently a saturated or unsaturated hydrocarbon or an aromatic organic group having 1 to 20 carbon atoms, and $R_{12}$ and $R_{13}$ may be joined with each other to form a cyclic compound); a trimethylsilyl group; a tert-butyl group; a menthyl group; a isobornyl group; a 2-methyl-2-adamantyl group; a dicyclopropylmethyl (Dcpm) group; a dimethylcyclo propyl methyl (Dmcp) group; groups represented by the following Formulae:

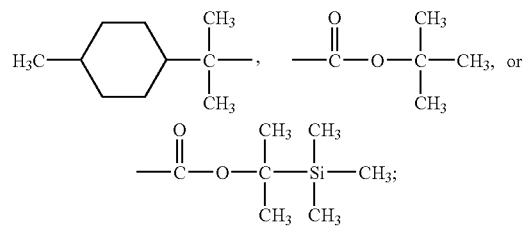

and mixtures thereof.

10. The composition as claimed in claim 7, wherein, assuming that the weight of the soluble polyimide is "A" and the weight of the polyamic acid is "B", the weight ratio of the soluble polyimide to the total weight of the soluble polyimide and the polyamic acid [A/(A+B)] is from about 0.01 to about 0.95,
- the amount of the Photo Acid Generator used is within the range of from about 0.1 to about 50 parts by weight and the amount of the dissolution inhibitor is from about 0.05 to about 50 parts by weight, relative to 100 parts by weight of the total amount of the soluble polyimide and the polyamic acid, and
- a solid content of the composition is within the range of from about 5 to about 50% by weight, based on the total weight of the composition.

11. The composition as claimed in claim 6, in which the polyamic acid of Formula 4 includes a siloxane repeating unit, represented by Formula 5 at Y, in the amount of 1–50% of total repeating units:

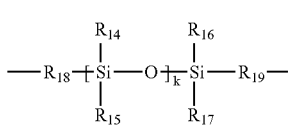

Formula 5 wherein:
- $R_{14}$, $R_{15}$, $R_{16}$ and $R_1$, are each independently an alkyl group, an aryl group, an alkoxy group or hydroxyl group,
- $R_{18}$ and $R_{19}$ are each independently a divalent alkyl group or aryl group, and
- k is an integer of from 1 to 10.

12. The composition as claimed in claim 6, wherein the Photo Acid Generator is one or more compounds selected from the group consisting essentially of halogenides, sulfone compounds, ammonium compounds, diazonium compounds, iodonium compounds, sulfonium compounds, phosphonium compounds, onium polymer compounds, selenium compounds and arsenium compounds, used alone or in combination with one another.

13. The composition as claimed in claim 6, wherein the polar solvent is selected from the group consisting essentially of N-methyl-2-pyrrolidone, N,N'-dimethylacetoamide, dimethylformamide, dimethyl sulfoxide, acetonitrile, diglyme, γ-butyrolactone, phenol, cyclohexanone, toluene, cyclohexane, and mixtures thereof.

14. A photosensitive insulating layer or a photosensitive protective layer prepared by using the composition as claimed in claim 6.

15. A semiconductor device comprising an insulating layer, a protective layer or a buffer layer prepared by using the composition as claimed in claim 6.

* * * * *